United States Patent
Wang

(10) Patent No.: US 10,666,262 B2
(45) Date of Patent: May 26, 2020

(54) PROGRAMMABLE ARRAY LOGIC

(71) Applicant: Nuvoton Technology Corporation, Hsinchu (TW)

(72) Inventor: Cheng-Chih Wang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/427,320

(22) Filed: May 30, 2019

(65) Prior Publication Data

US 2020/0044655 A1  Feb. 6, 2020

(30) Foreign Application Priority Data

Aug. 1, 2018 (TW) .............................. 107126723 A

(51) Int. Cl.

| G06F 7/38 | (2006.01) |
|---|---|
| H03K 19/177 | (2020.01) |
| H03K 19/17704 | (2020.01) |
| H03K 19/1776 | (2020.01) |
| G11C 13/00 | (2006.01) |
| H03K 19/17736 | (2020.01) |

(52) U.S. Cl.
CPC ..... *H03K 19/17708* (2013.01); *G11C 13/004* (2013.01); *G11C 13/0069* (2013.01); *H03K 19/1776* (2013.01); *H03K 19/17744* (2013.01); *G11C 2013/0045* (2013.01); *G11C 2013/0078* (2013.01); *G11C 2213/79* (2013.01)

(58) Field of Classification Search
None
See application file for complete search history.

(56) References Cited

U.S. PATENT DOCUMENTS

| 4,758,746 A | 7/1988 | Birkner et al. |
|---|---|---|
| 4,774,421 A | 9/1988 | Hartmann et al. |
| 5,781,031 A | 7/1998 | Bertin et al. |
| 9,059,705 B1 | 6/2015 | Edelhaeuser |
| 2008/0211539 A1* | 9/2008 | Parkinson .......... G11C 13/0004 326/41 |
| 2010/0073025 A1* | 3/2010 | Tanamoto .......... H03K 19/1776 326/41 |
| 2010/0091561 A1* | 4/2010 | Lowrey ............. G11C 13/0004 365/163 |
| 2011/0254587 A1* | 10/2011 | Chua-Eoan ...... H03K 19/17736 326/39 |

FOREIGN PATENT DOCUMENTS

TW        200417829        9/2004

* cited by examiner

*Primary Examiner* — Anh Q Tran
(74) *Attorney, Agent, or Firm* — JCIPRNET

(57) ABSTRACT

A programmable array logic includes a plurality of first signal lines, a plurality of second signal lines coupled to input terminals of a plurality of programmable AND gates, a plurality of first control units coupled to the first signal lines and second signal lines, a plurality of third signal lines coupled to output terminals of the programmable AND gates, a plurality of fourth signal lines coupled to input terminals of a plurality of programmable OR gates, and a plurality of second control units coupled to the third signal lines and the fourth signal lines. Each of the first control units has at least a first resistive memory for setting voltage level relationship between the first signal lines and the second signal lines. Each of second control units has a second resistive memory for setting voltage level relationship between the third signal lines and the fourth signal lines.

11 Claims, 4 Drawing Sheets

PROGRAMMABLE ARRAY LOGIC

CROSS-REFERENCE TO RELATED APPLICATION

This application claims the priority benefit of Taiwan application serial no. 107126723, filed on Aug. 1, 2018. The entirety of the above-mentioned patent application is hereby incorporated by reference herein and made a part of this specification.

BACKGROUND

Technical Field

The invention relates to a programmable circuit, and more particularly to a programmable array logic.

Description of Related Art

Programmable array logic (PAL) is a programmable logic device that can implement a combinational logic circuit. The programmable array logic has a set of programmable AND gates and a set of programmable OR gates configured to allow a logic signal output to be enabled when the conditions are met. Since the programmable array logic is easier to program, the programmable array logic has been widely used. However, in the field of programming, the flexibility, performance and cost are steady trends, therefore, there is still a need for a newer circuit design.

SUMMARY

The invention provides a programmable array logic, which can set the relationship between the voltage levels of the signal lines by setting and resetting the resistive memory, so as to improve the flexibility and performance of the use without compromising hardware cost.

In an embodiment of the invention, the programmable array logic includes a plurality of programmable AND gates, a plurality of first signal lines, a plurality of second signal lines, a plurality of first control units, a plurality of programmable OR gates, a plurality of third signal lines, a plurality of fourth signal lines, and a plurality of second control units. These second signal lines are respectively coupled to the input terminals of the programmable AND gates. The first control unit is coupled to the corresponding first signal line and the corresponding second signal line, and each first control unit has at least a first resistive memory, and the first resistive memory is configured to isolate the coupled first signal line from the coupled second signal line, and set a relationship between a voltage level of the corresponding first signal line and a voltage level of the corresponding second signal line. The third signal lines are respectively coupled to the output terminals of the programmable AND gates, and the fourth signal lines are respectively coupled to the input terminals of the programmable OR gates. The second control unit is coupled to the corresponding third signal line and the corresponding fourth signal line, and each second control unit has a second resistive memory, the second resistive memory is configured to isolate the coupled third signal line from the coupled fourth signal line, and set a relationship between a voltage level of the corresponding third signal line and a voltage level of the corresponding fourth signal line.

Based on the above, the programmable array logic of the embodiment of the invention can set the relationship between the voltage levels of the first and second signal lines according to the information stored in the first resistive memory, and set the relationship between the voltage levels of the third and fourth signal lines according to the information stored in the second resistive memory. As a result, the flexibility and performance of the use can be improved without compromising the hardware cost.

The above described features and advantages of the invention will be more apparent from the following description.

DESCRIPTION OF THE EMBODIMENTS

Figure 1:
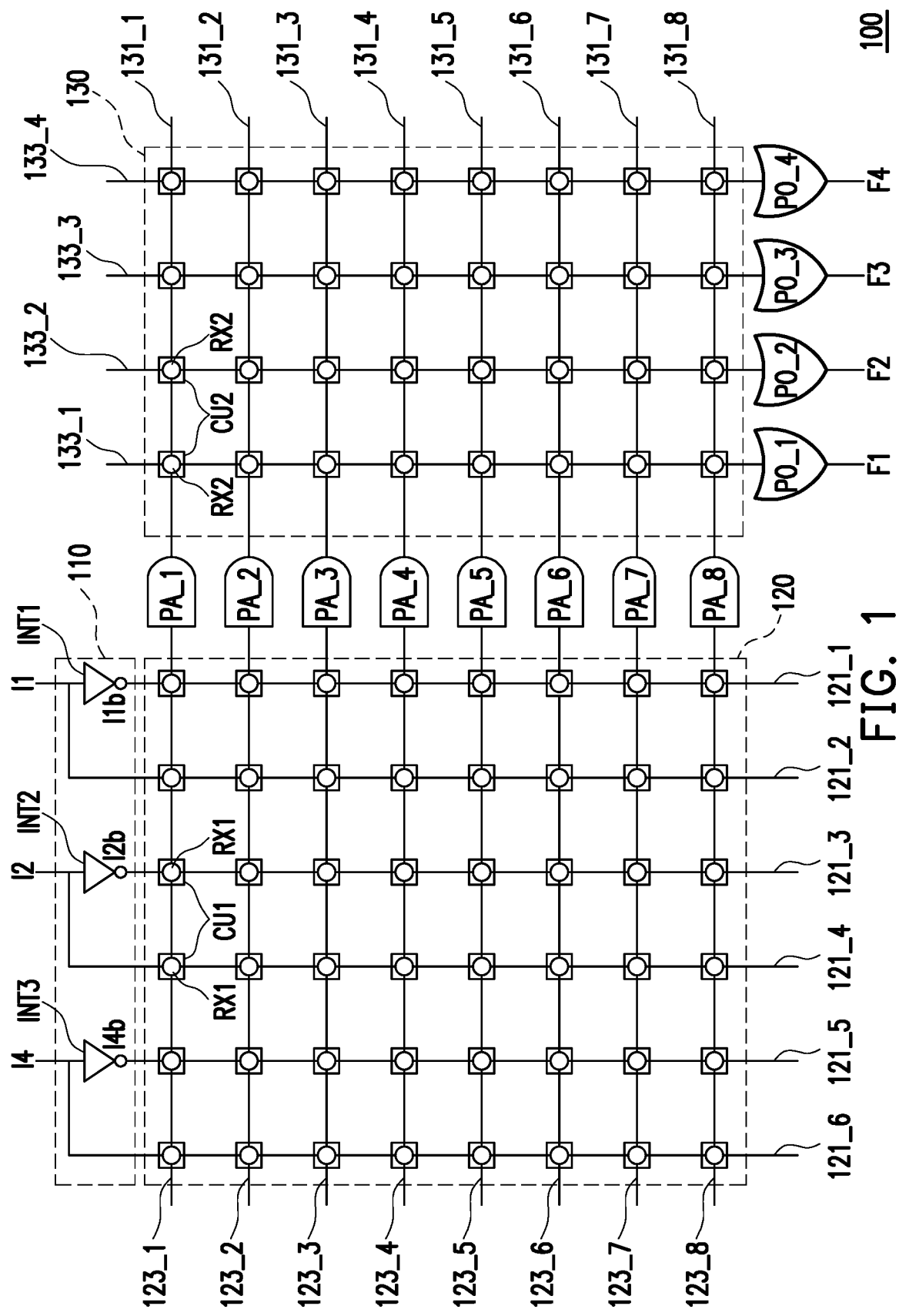
FIG. 1 is a schematic diagram of a system of programmable array logic according to an embodiment of the invention.

FIG. 1 is a schematic diagram of a system of programmable array logic according to an embodiment of the invention. Referring to FIG. 1, in the embodiment, a programmable array logic 100 includes an inverting/non-inverting block 110, a wire-AND logic array 120, a plurality of programmable AND gates (e.g., PA_1~PA_8), a wire-OR logic array 130, and a plurality of programmable OR gates (e.g., PO_1~PO_4). The amount of the programmable AND gates (e.g., PA_1~PA_8) and programmable OR gates (e.g., PO_1~PO_4) used are for illustrative purposes, the embodiments of the invention is not limited thereto.

The inverting/non-inverting block 110 receives a plurality of input bits (e.g., I1, I2, and I4) to respectively provide the input bits (e.g., I1, I2, and I4) and inverted input bits (e.g., I1$b$, I2$b$ and I4$b$). In detail, the inverting/non-inverting block 110 can include a plurality of inverters (e.g., INT1~INT3) that respectively receive the input bits, (e.g., I1, I2, and I4) to respectively provide the inverted input bits (e.g., I1$b$, I2$b$, and I4$b$), and the input bits (e.g., I1, I2, and I4) are bypassed from input terminals of the inverting/non-inverting block 110 to output terminals of the inverting/non-inverting block 110 through wires. Thereby, the inverting/non-inverting block 110 can provide the input bits (e.g., I1, I2, and I4) and the respective inverted input bits (e.g., I1$b$, I2$b$, and I4$b$).

The wire-AND logic array 120 includes a plurality of first signal lines (e.g., 121_1~121_6), a plurality of second signal lines (e.g., 123_1~123_8), and a plurality of first control units CU1. One end of the first signal lines (e.g., 121_1~121_6) is coupled to the inverting/non-invertng block 110 to receive the input bits (e.g., I1, I2, and I4) and the inverted input bits (e.g., I1$b$, I2$b$, and I4$b$). Moreover, each of the first signal lines (e.g., 121_1~121_6) receives, foexample, a corresponding input bit (e.g., one of the input bits I1, I2, and I4) or a corresponding inverted input bit (e.g., one of the inverted input bits I1$b$, I2$b$, and I4$b$).

The second signal lines (e.g., 123_~123_8) are intersected with the first signal lines (e.g., 121_1~121_6) and are respectively coupled to input terminals of the programmable AND gates (e.g., PA_1~PA_8). The first control units CU1 are disposed at intersection of the first signal lines (e.g., 121_1~121_6) and the second signal lines (e.g., 123_1~123_8), and are respectively coupled to the corresponding first signal line (e.g., one of the first signal lines 121_1~121_6) and the corresponding second signal line (e.g., one of the second signal lines 123_1~123_8). Each first control unit CU1 has at least a first resistive memory RX1, wherein the first resistive memory RX1 is configured to isolate a first signal line (e.g., one of the first signal line 121_1~121_6) coupled thereto from a second signal line (e.g., one of the first signal line 123_1~123_8) coupled thereto, that is, the first signal line (e.g., one of the first signal lines 121_1~121_6) is not conducted to the second signal line (e.g., one of the second signal lines 123_1~123_8) through first resistive memory RX1 for any time. Moreover, the first resistive memory RX1 sets a relationship of a voltage level of the corresponding (coupled) first signal line (e.g., one of the first signal lines 121_1~121_6) and the corresponding (coupled) second signal line (e.g., one of the second signal lines 123_1~123_8) according to a stored bit information.

The wire-OR logic array 130 includes a plurality of third signal lines (e.g., 131_1~131_8), a plurality of fourth signal lines (e.g., 133_1~133_6), and a plurality of second control units CU2. The third signal lines (e.g., 131_1~131_8) are coupled to output terminals of the programmable AND gates (e.g., PA_1~PA_8), and the fourth signal lines (e.g., 133_1~133-4) are coupled to input terminals of the programmable OR gates (e.g., PO_1~PO_4). In addition, the third signal lines (e.g., 131_1~131_8) and the fourth signal lines (e.g., 133_1~133_4) are intersected with each other. The programmable OR gates (e.g., PO_1~PO_4) provides a plurality of output bits (e.g., F1, F2, F3, and F4).

The second control units CU2 are disposed at intersection of the third signal lines (e.g., 131_1~131_8) and the fourth signal lines (e.g., 133_1~133_4), and are respectively coupled to the corresponding third signal line (e.g., one of the third signal lines 131_1~131_8) and the corresponding fourth signal line (e.g., one of the fourth signal lines 133_1~133_4). Each second control unit CU2 has a second resistive memory RX2, wherein the second resistive memory RX2 is configured to isolate a third signal line (e.g., one of third first signal lines 131_1~131_8) coupled thereto from a fourth signal line (e.g., one of the fourth signal lines 133_1~133_4) coupled thereto, that is, the third signal line (e.g., one of the third signal lines 131_1~131_8) is not conducted to the fourth signal line (e.g., one of the fourth signal lines 133_1~133_4) through the second resistive memory RX2 for any time. The second resistive memory RX2 sets a relationship of a voltage level of the corresponding (coupled) third signal line (e.g., one of the third signal lines 131_1~131_8) and the corresponding (coupled) fourth signal line (e.g., one of the fourth signal lines 133_1~133_4 according to the stored bit information.

According to the above, since the first resistive memory RX1 and the second resistive memory RX2 can be set and reset repeatedly, that is, the relationship between the voltage levels of the first signal line (e.g., one of the first signal lines 121_1~121_6 and the second signal line (e.g., one of the second signal lines 123_1~123_8), and the relationship between the voltage levels of the third signal line (e.g., one of the third signal lines 131_1~131_8) and the fourth signal line (e.g., one of fourth first signal lines 133_1~133_4) can be reset repeatedly, so that the flexibility and performance of the programmable array logic 100 can be improved and the cost of use can also be reduced.

Among them, the amount of the first signal lines (e.g., 121_1~121_6), the second signal lines (e.g., 123_1~123_8), the third signal lines (e.g., 131_1~131_8), and the fourth signal lines (e.g., 133_1~133_4) used are for illustrative purposes, the embodiment of the invention is not limited thereto.

Figure 2:
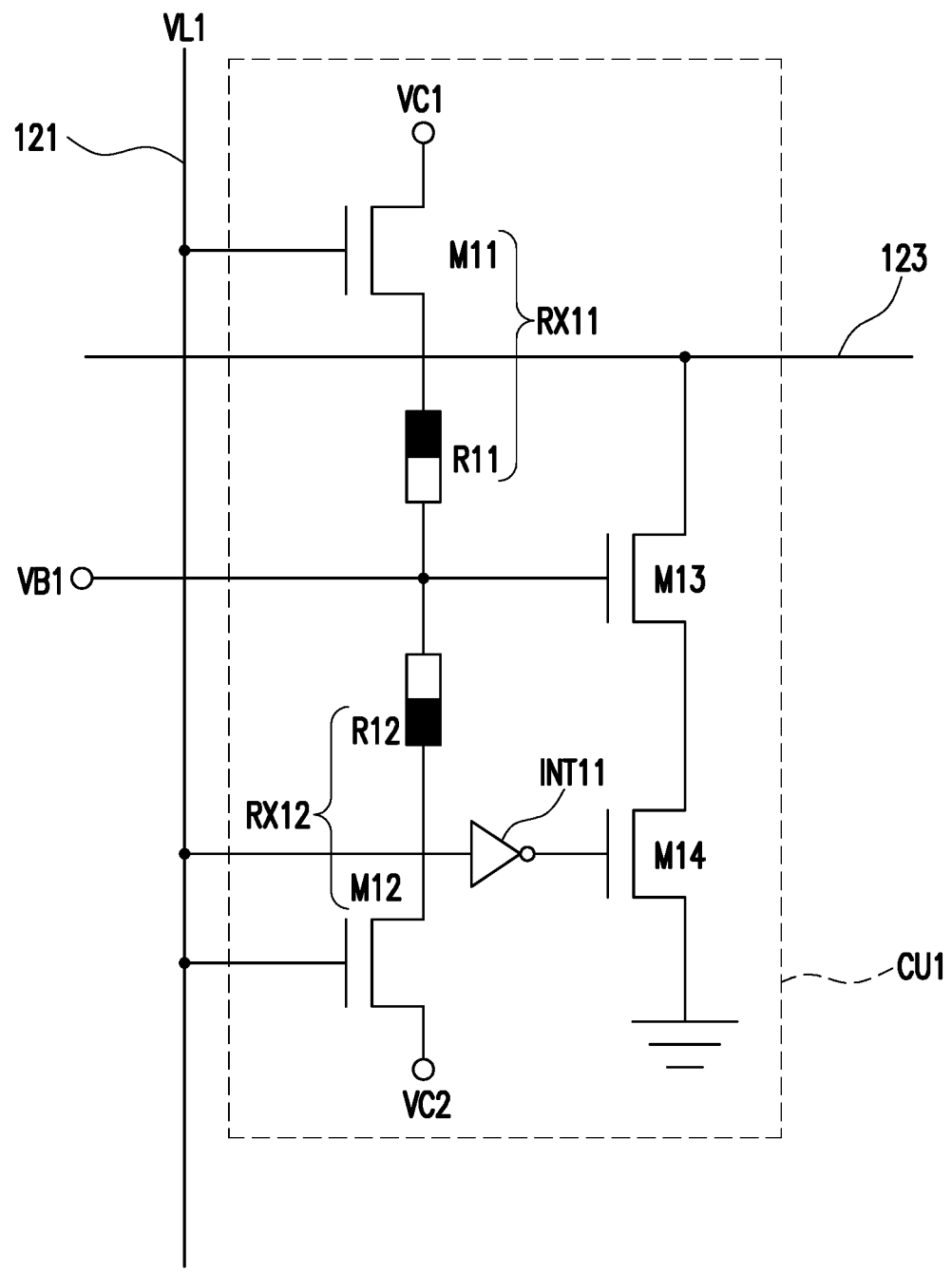
FIG. 2 is a schematic diagram of a circuit of a first control unit according to an embodiment of the invention.

FIG. 2 is a schematic diagram of a circuit of a first control unit according to an embodiment of the invention. Please refer to FIG. 1 and FIG. 2, wherein same or similar reference numerals are used for same or similar parts. In this embodiment, each first control unit CU1 includes a resistive memory RX11 (corresponding to the first resistive memory), a resistive memory RX12 (corresponding to a third resistive memory), an inverter INT11 (corresponding to the first inverter), transistors M13 and M14 (corresponding to a first switch and a second switch). The resistive memory RX11 includes a transistor M11 and an impedance element R11, and the resistive memory RX12 includes a transistor M12 and an impedance element R12.

A first terminal of the transistor M11 (corresponding to a first terminal of the first resistive memory) receives a first control voltage VC1, a control terminal of the transistor M11 (corresponding to a control terminal of the first resistive memory) is coupled to a corresponding first signal line 121, a second terminal of the transistor M11 is coupled to an anode of the impedance element R11. A cathode of the impedance element R11 (corresponding to a second terminal of the first resistive memory) receives a first line bias voltage VB1, a first terminal of the transistor M12 (corresponding to a first terminal of the third resistive memory) receives a second control voltage VC2, and a control terminal of the transistor M12 (corresponding to a control terminal of the third resistive memory) is coupled to the corresponding first signal line 121, a second terminal of the transistor M12 is coupled to an anode of the impedance element R12. A cathode of the impedance element R12 (corresponding to a second terminal of the third resistive memory) receives the first line bias voltage VB1.

An input terminal of the inverter INT11 is coupled to the corresponding first signal line 121. A first terminal of the transistor M13 (corresponding to a first terminal of the first switch) is coupled to a corresponding second signal line 123, a control terminal of the transistor M13 (corresponding to a control terminal of the first switch) receives the first line bias voltage VB1, a second terminal of the transistor M13 (corresponding to a second terminal of the first switch) is coupled to a first terminal of the transistor M14 (corresponding to a first terminal of the second switch). A control terminal of the transistor M14 (corresponding to a control terminal of the second switch) is coupled to an output terminal of the inverter IN11, and a second terminal of the transistor M14 (corresponding to a second terminal of the second switch) receives a ground voltage.

TABLE 1

| Working Status | VB1 | VC1 | VC2 | VL1 |
| --- | --- | --- | --- | --- |
| Operating Mode | Floating State | Read Voltage | Ground Voltage | Received Voltage |
| First Setting Mode | Double Programming Voltage | Single Programming Voltage | Single Programming Voltage | Read Voltage |
| Second Setting Mode | Ground Voltage | Single Programming Voltage | Single Programming Voltage | Read Voltage |

As shown in Table 1, the first control unit CU1 is roughly divided into an operating mode and a setting mode (i.e., a first setting mode and a second setting mode), wherein the first control unit CU1 is generally operated in the operating mode, and the setting mode is used to set or reset the resistive memories RX11 and RX12. Furthermore, in the operating mode, the first line bias voltage VB1 is in a floating state, that is, the first line bias voltage VB1 is not supplied to the control terminal of the transistor M13. Therefore, a voltage level of the control terminal of the transistor M13 is not affected by the first line bias voltage VB1. The first control voltage VC1 is at a normal logic level and used as a read voltage of the bit information (impedance value) of the resistive memories RX11 and RX12; the second control voltage VC2 is the ground voltage. A line voltage VL1 changes with a received voltage.

In the setting mode for setting the resistive memories RX11 and RX12 (i.e., the first setting mode), the first line bias voltage VB1 is a double programming voltage, that is, the first line bias voltage VB1 is two times of the set voltage for programming the resistive memory RX11 and RX12. The first control voltage VC1 and the second control voltage VC2 are single programming voltages. After that, each of the resistive memories RX11 and RX12 stores a logic bit "1", that is, each of the resistive memory RX11 and RX12 has low impedance. Then, in the operating mode, the voltage level of the control terminal of the transistor M13 and the control terminal of the translator M14 are dependent on the logic level (voltage level) of the line voltage VL1 of the first signal line 121, that is, after the first setting mode, a voltage level of the corresponding second signal line 123 is dependent on a voltage level of the corresponding first signal line 121.

In the setting mode for resetting the resistive memories RX11 and RX12 (i.e., the second setting mode), the first line bias voltage VB1 is the ground voltage, and the first control voltage VC1 and the second control voltage VC2 are single programming voltages. After that, each of the resistive memories RX11 and RX12 stores the logic bit "0", that is, each of the resistive memories RX11 and RX12 has high impedance. Then, in the operating mode, the voltage level of the control terminal of the transistor M13 and the control terminal of the transistor M14 is independent of the logic level (voltage level) of the line voltage VL1 of the first signal line 121, that is, after the second setting mode, the voltage level of the corresponding second signal line 123 is independent of the voltage level of the corresponding first signal line 121.

Figure 3:
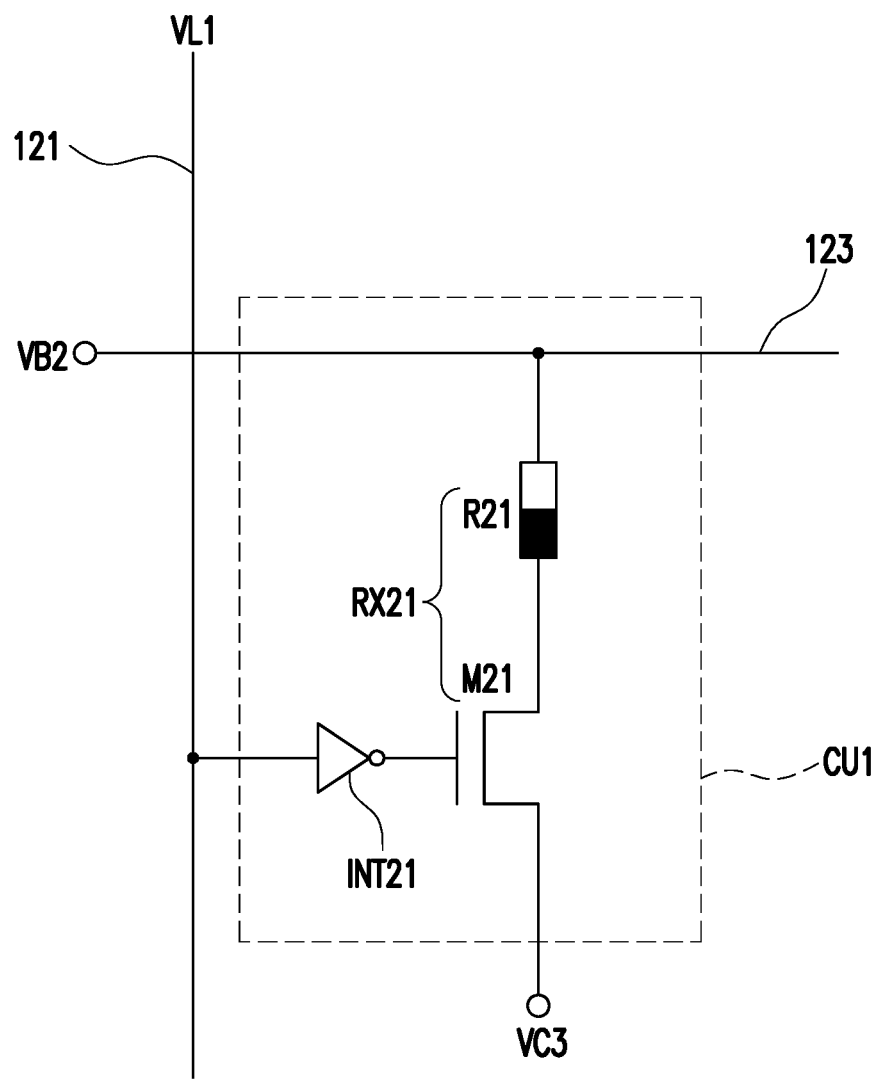
FIG. 3 is a schematic diagram of a circuit of a first control unit according to an embodiment of the invention.

FIG. 3 is a schematic diagram of a circuit of a first control unit according to an embodiment of the invention. Please refer to FIG. 1 and FIG. 3, wherein the same or similar reference numerals are used for the same or similar parts. In this embodiment, each of the first control units CU1 includes a resistive memory RX21 (corresponding to the first resistive memory) and an inverter INT21 (corresponding to the second inverter), wherein the resistive memory RX21 includes a transistor M21 and an impedance element R21.

An input terminal of the inverter INT21 is coupled to the corresponding first signal line 121. A first terminal of the transistor M21 (corresponding to the first terminal of the first resistive memory) receives a third control voltage VC3, and a control terminal of the transistor M21 (corresponding to the control terminal of the first resistive memory) is coupled to an output terminal of the inverter INT21, and a second terminal of the transistor M21 is coupled to an anode of the impedance element R21. A cathode of the impedance element R21 (corresponding to the second terminal of the first resistive memory) is coupled to the corresponding second signal line 123.

TABLE 2

| Working Status | VB2 | VC3 | VL1 |
| --- | --- | --- | --- |
| Operating Mode | Floating Status | Ground Voltage | Received Voltage |
| First Setting Mode | Single Programming Voltage | Ground Voltage | Ground Voltage |
| Second Setting Mode | Ground Voltage | Single Programming Voltage | Ground Voltage |

As shown in Table 2, the working modes of the first control unit CU1 are roughly divided into the operating mode and the setting mode (for example, the first setting mode and the second setting mode), wherein the first control unit CU1 is generally operated in the operating mode, and the setting mode is used to set or reset the resistive memory RX21. Furthermore, in the operating mode, a second line bias voltage VB2 is in the floating state, that is, the second line bias voltage VB2 is not provided to the corresponding second signal line 123. The third control voltage VC3 is the ground voltage. A voltage level of the first signal line 121 (i.e., the line voltage VL1) changes with the received voltage.

In the setting mode for setting the resistive memory RX21 (i.e., the first setting mode), the second line bias voltage VB2 is supplied to the corresponding second signal line 123 and is the single programming voltage, that is, the set voltage for programming the resistive memory RX21. The third control voltage VC3 is the ground voltage, and the line voltage VL1 is the ground voltage. Thereafter, the resistive memory RX21 stores the logic bit "1", that is, the resistive memory RX21 has low impedance. Then, in the operating mode, the voltage level of the corresponding second signal line 123 is dependent on a conduction state of the transistor M21, that is, after the first setting mode, the voltage level of the corresponding second signal line 123 is dependent on the line voltage VL1.

In the setting mode for resetting the resistive memory RX21 (i.e., the second setting mode), the second line bias voltage VB2 is supplied to the corresponding second signal line 123 and is the ground voltage, the third control voltage VC3 is the single programming voltage, and the line voltage VL1 is the ground voltage. Thereafter, the resistive memory RX21 stores the logic bit "0", that is, the resistive memory RX21 has high impedance. Then, in the operating mode, the voltage level of the corresponding second signal line 123 is independent of the conduction state of the transistor M21, that is, after the second setting mode, the voltage level of the corresponding second signal line 123 is independent of the line voltage VL1.

Figure 4:
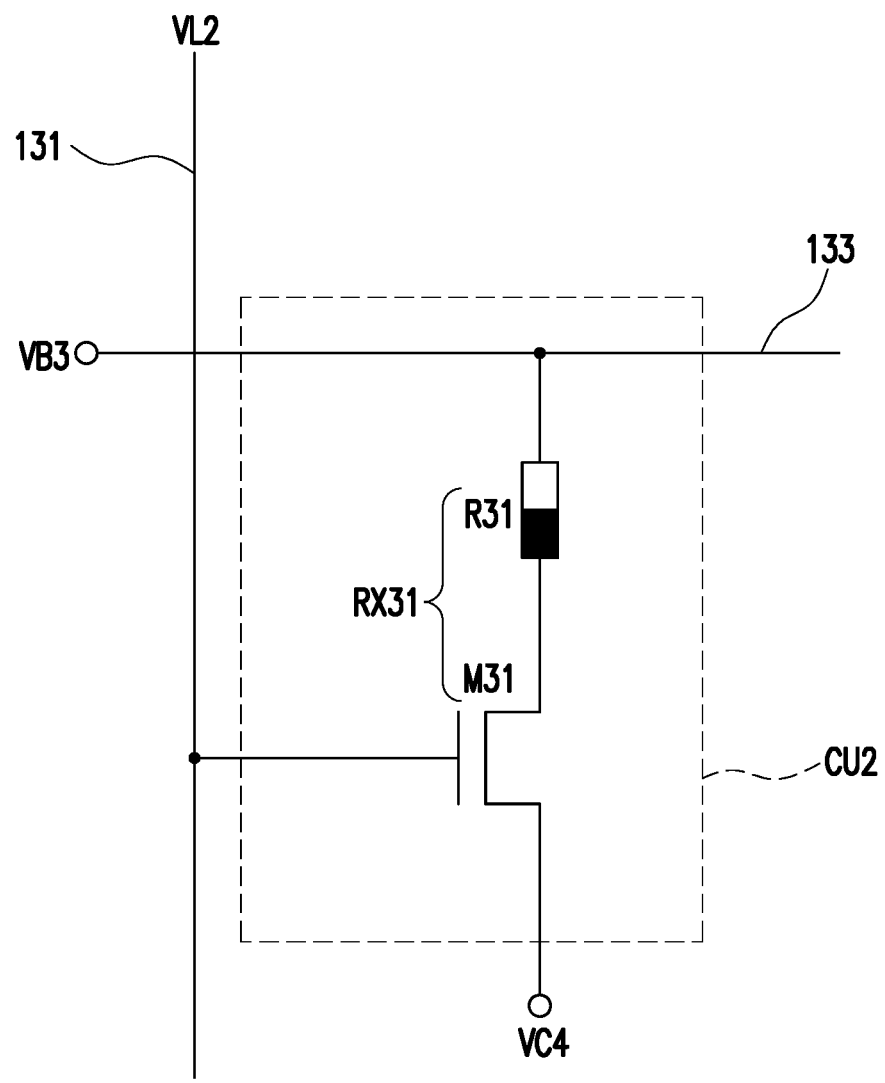
FIG. 4 is a schematic diagram of a circuit of a second control unit according to an embodiment of the invention.

FIG. 4 is a schematic diagram of a circuit of a second control unit according to an embodiment of the invention. Please refer to FIG. 1 and FIG. 4, wherein same or similar reference numerals are used for same or similar parts. In this embodiment, each of the second control units CU2 includes a resistive memory RX31 (corresponding to the second resistive memory), wherein the resistive memory RX31 includes a transistor M31 and an impedance element R31. A first terminal of the transistor M31 (corresponding to the first terminal of the second resistive memory) receives a fourth control voltage VC4, and a control terminal of the transistor M31 (corresponding to a control terminal of the second resistive memory) is coupled to the corresponding a third signal line 131, and a second terminal of the transistor M31 is coupled to an anode of the impedance element R31. A cathode of the impedance element R31 (corresponding to a second terminal of the second resistive memory) is coupled to a corresponding fourth signal line 133.

TABLE 3

| Working Status | VB3 | VC4 | VL2 |
|---|---|---|---|
| Operating Mode | Floating State | Ground Voltage | Received Voltage |
| First Setting Mode | Single Programming Voltage | Ground Voltage | Read Voltage |
| Second Setting Mode | Ground Voltage | Single Programming Voltage | Read Voltage |

As shown in Table 3, the working modes of the second control unit CU2 can be roughly divided into the operating mode and the setting mode (for example, the first setting mode and the second setting mode), wherein the second control unit CU2 is generally operated in the operating mode, and the setting mode is used to set or reset the resistive memory RX31. Furthermore, in the operating mode, a third line bias voltage VB3 is in the floating state, that is, the third line bias voltage VB3 is not provided to the corresponding fourth signal line 133; the fourth control voltage VC4 is the ground voltage; a voltage level of the corresponding third signal line 131 (i.e., a line voltage VL2) changes with the received voltage.

In the setting mode for setting the resistive memory RX31 (that is, the first setting mode), the third line bias voltage VB3 is supplied to the corresponding fourth signal line 133 and is the single programming voltage, that is, the set voltage for programming the resistive memory RX31; the fourth control voltage VC4 is the ground voltage; and the line voltage VL2 is the read voltage. Thereafter, the resistive memory RX31 stores the logic bit "1", that is, the resistive memory RX31 has low impedance. Then, in the operating mode, a voltage level of the corresponding fourth signal line 133 is dependent on a conduction state of the transistor M31, that is, after the first setting mode, the voltage level of the corresponding fourth signal line 133 is dependent on the line voltage VL2.

In the setting mode for resetting the resistive memory RX31 (i.e., the second setting mode), the third line bias voltage VB3 is supplied to the corresponding fourth signal line 133 and is the ground voltage, and the fourth control voltage VC3 is the single programming voltage; the line voltage VL2 is the read voltage. Thereafter, the resistive memory RX31 stores the logic bit "0", that is, the resistive memory RX31 has high impedance. Then, in the operating mode, the voltage level of the corresponding fourth signal line 133 is independent of the conduction state of the transistor M31, that is, after the second setting mode, the voltage level of the corresponding fourth signal line 133 is independent of the line voltage VL2.

In summary, the programmable array logic of the embodiment of the invention can set the voltage levels of the first and second signal lines by setting and resetting the first (and third) resistive memory. The relationship between the voltage levels of the third and fourth signal lines can be set by setting and resetting the second resistive memory. Thereby, the flexibility and performance of the use can be improved, and the hardware cost can be taken into consideration.

Although the present invention has been disclosed in the above embodiments, it is not intended to limit the invention, and those skilled in the art can make a few changes without departing from the spirit and scope of the invention. The scope of protection of the present invention is defined by the scope of the appended claims.

What is claimed is:

1. A programmable array logic, comprising:
    a plurality of programmable AND gates;
    a plurality of first signal lines and a plurality of second signal lines, wherein the second signal lines are respectively coupled to input terminals of programmable AND gates;
    a plurality of first control units, respectively coupled to the corresponding first signal line and the corresponding second signal line, wherein each of the first control units has at least one first resistive memory, and the first resistive memory is configured to permanently isolate a first signal line coupled thereto from a second signal line coupled thereto, and set a relationship between a voltage level of the corresponding first signal line and a voltage level of the corresponding second signal line;
    a plurality of programmable OR gates;
    a plurality of third signal lines and a plurality of fourth signal lines, wherein the third signal lines are respectively coupled to output terminals of the programmable AND gates, and the fourth signal lines are respectively coupled to input terminals of programmable OR gates; and
    a plurality of second control units, respectively coupled to the corresponding third signal line and the corresponding fourth signal line, wherein each of the second control units has a second resistive memory, and the second resistive memory is configured to permanently isolate a third signal line coupled thereto from a fourth signal line coupled thereto, and set a relationship between a voltage level of the corresponding third signal line and a voltage level of the corresponding fourth signal line.

2. The programmable array logic according to claim 1, wherein each of the first control units comprises:
    the first resistive memory, having a first terminal receiving a first control voltage, a control terminal coupled to the corresponding first signal line, and a second terminal receiving a first line bias voltage;
    a third resistive memory, having a first terminal receiving a second control voltage, a control terminal coupled to the corresponding first signal line, and a second terminal receiving the first line bias voltage;
    a first inverter, having an input terminal coupling to the corresponding first signal line and an output terminal;
    a first switch, having a first terminal coupled to the corresponding second signal line, a control terminal receiving the first line bias voltage, and a second terminal; and
    a second switch, having a first terminal coupled to the second terminal of the first switch, a control terminal coupled to the output terminal of the first inverter, and a second terminal receiving a ground voltage.

3. The programmable array logic according to claim 2, wherein in an operating mode, the first line bias voltage is a floating state, and the first control voltage is a read voltage, and the second control voltage is the ground voltage,
    in a first setting mode, the first line bias voltage is a double programming voltage, and the first control voltage and the second control voltage are a single programming voltage, and in a second setting mode, the first line bias voltage is the ground voltage, and the first control voltage and the second control voltage are the single programming voltage.

4. The programmable array logic according to claim 3, wherein after the first setting mode, a voltage level of the corresponding second signal line is dependent on a voltage level of the corresponding first signal line, and after the second setting mode, the voltage level of the corresponding second signal line is independent of the voltage level of the corresponding first signal line.

5. The programmable array logic according to claim 1, wherein each of the first control units comprises:
   the first resistive memory having a first terminal receiving a third control voltage, a control terminal, and a second terminal coupled to the corresponding second signal line; and
   a second inverter having an input coupled to the corresponding first signal line, and an output coupled to the control terminal of the first resistive memory.

6. The programmable array logic according to claim 5, wherein in an operating mode, the corresponding second signal line does not receive a second line bias voltage, and the third control voltage is a ground voltage,
   in a first setting mode, the second line bias voltage is a programming voltage and is applied to the corresponding second signal line, the third control voltage is the ground voltage, and a voltage level of the corresponding first signal line is the ground voltage, and
   in a second setting mode, the second line bias voltage is the ground voltage and is applied to the corresponding second signal line, the third control voltage is the programming voltage, and the voltage level of the corresponding first signal line is the ground voltage.

7. The programmable array logic according to claim 6, wherein after the first setting mode, a voltage level of the corresponding second signal line is dependent on the voltage level of the corresponding first signal line, after the second setting mode, the voltage level of the corresponding second signal line is independent of the voltage level of the corresponding first signal line.

8. The programmable array logic according to claim 1, wherein each of the second control units comprises:
   the second resistive memory having a first terminal receiving a fourth control voltage, a control terminal coupled to the corresponding third signal line, and a second terminal coupled to the corresponding fourth signal line.

9. The programmable array logic according to claim 8, wherein in an operating mode, the corresponding fourth signal line does not receive a third line bias voltage, and the fourth control voltage is a ground voltage,
   in a first setting mode, the third line bias voltage is a programming voltage and is applied to a corresponding fourth signal line, the fourth control voltage is the ground voltage, and the voltage level of the corresponding third signal line is a read voltage, and
   in a second setting mode, the third line bias voltage is the ground voltage and is applied to the corresponding fourth signal line, the fourth control voltage is the programming voltage, and the voltage level of the corresponding third signal line is the read voltage.

10. The programmable array logic according to claim 1, further comprising an inverting/non-inverting block coupled to the first signal lines, wherein the first signal lines receive a plurality of input bits and a plurality of inverted input bits, the programmable OR gates provide a plurality of output bits, and the inverting/non-inverting block receives the input bits to provide the input bits and the inverted input bits, wherein the inverting/non-inverting block comprises a plurality of inverters, respectively receiving corresponding input bits to provide corresponding inverted input bits.

11. The programmable array logic according to claim 1, wherein the first resistive memory comprises a first impedance element, a cathode of the first impedance element is coupled to the corresponding second signal line, and the first resistive memory is configured to set the relationship between the voltage level of the first signal line which is coupled to the first resistive memory and the voltage level of the second signal line which is coupled to the first resistive memory,
   wherein the second resistive memory comprises a second impedance element, a cathode of the second impedance element is coupled to the corresponding fourth signal line, and the second resistive memory is configured to set the relationship between the voltage level of the third signal line which is coupled to the second resistive memory and the voltage level of the fourth signal line which is coupled to the second resistive memory.

* * * * *